(12) United States Patent
Yoon

(10) Patent No.: US 9,166,191 B2
(45) Date of Patent: Oct. 20, 2015

(54) DISPLAY DEVICE, METHOD OF MANUFACTURING THE DISPLAY DEVICE AND CARRIER SUBSTRATE FOR MANUFACTURING DISPLAY DEVICE

(71) Applicant: Samsung Display Co., Ltd., Yongin, Gyeonggi-Do (KR)

(72) Inventor: Young-Sik Yoon, Yongin (KR)

(73) Assignee: Samsung Display Co., Ltd., Giheung-Gu, Yongin-si, Gyeonggi-Do (KR)

( * ) Notice: Subject to any disclaimer, the term of this patent is extended or adjusted under 35 U.S.C. 154(b) by 79 days.

(21) Appl. No.: 13/793,932

(22) Filed: Mar. 11, 2013

(65) Prior Publication Data

US 2014/0145587 A1     May 29, 2014

(30) Foreign Application Priority Data

Nov. 26, 2012    (KR) ........................ 10-2012-0134871

(51) Int. Cl.
     *H01L 27/32*      (2006.01)
     *H01L 21/673*      (2006.01)
     *H01L 21/683*      (2006.01)
     (Continued)

(52) U.S. Cl.
     CPC ........ *H01L 51/5246* (2013.01); *H01L 21/6835* (2013.01); *H01L 51/003* (2013.01); *H01L 2221/6835* (2013.01); *H01L 2221/68318* (2013.01); *H01L 2221/68381* (2013.01); *H01L 2227/326* (2013.01); *Y10T 428/2848* (2015.01); *Y10T 428/2857* (2015.01)

(58) Field of Classification Search
     CPC ............ H01L 21/67265; H01L 21/673; H01L 21/67303; H01L 21/67313; H01L 21/6732; H01L 21/67326–21/6733; H01L 21/6735; H01L 21/67363; H01L 21/67366; H01L 21/677; H01L 21/7688; H01L 21/0331; H01L 21/7813; H01L 2221/6835; H01L 2221/68381; H01L 2221/68359; H01L 2221/68363; H01L 2251/5338; H01L 51/003; H01L 51/0097; H01L 31/0236; H01L 31/18; H01L 31/1892
     USPC ............... 174/254; 156/247, 230; 445/24–25; 438/354, 455, 458; 313/498–512
     See application file for complete search history.

(56) References Cited

U.S. PATENT DOCUMENTS

| | | | |
|---|---|---|---|
| 7,372,167 B2 | 5/2008 | Otsuki | |
| 7,842,552 B2 | 11/2010 | Karidis et al. | |
| 8,877,619 B1 * | 11/2014 | Thompson et al. | 438/527 |

(Continued)

FOREIGN PATENT DOCUMENTS

| | | |
|---|---|---|
| KR | 1020050060733 | 6/2005 |
| KR | 100759087 | 9/2007 |

(Continued)

*Primary Examiner* — Anne Hines
*Assistant Examiner* — Jose M Diaz
(74) *Attorney, Agent, or Firm* — Robert E. Bushnell, Esq.

(57) ABSTRACT

A method of manufacturing a display device includes: preparing a carrier substrate by forming an adhesive layer on a hard glass substrate; forming a flexible substrate on the adhesive layer; forming a thin film transistor and an organic light emitting element on the flexible substrate and encapsulating the organic light emitting element; and separating the carrier substrate and the flexible substrate by irradiating laser light. The adhesive layer is formed on the carrier substrate in such a state that tensile stress is applied. The display device and the carrier substrate are also disclosed.

17 Claims, 5 Drawing Sheets

(51) Int. Cl.
*H01L 51/52* (2006.01)
*H01L 51/00* (2006.01)

(56) References Cited

U.S. PATENT DOCUMENTS

| | | | |
|---|---|---|---|
| 2004/0053449 A1* | 3/2004 | Chang et al. | 438/149 |
| 2007/0134849 A1 | 6/2007 | Vanfleteren et al. | |
| 2008/0116588 A1 | 5/2008 | Van Kleef et al. | |
| 2009/0096084 A1 | 4/2009 | Karidis et al. | |
| 2009/0261062 A1* | 10/2009 | Kim | 216/24 |
| 2010/0051178 A1* | 3/2010 | Lee et al. | 156/152 |
| 2011/0068462 A1 | 3/2011 | Karidis et al. | |
| 2013/0071999 A1* | 3/2013 | Cheng et al. | 438/478 |
| 2014/0065389 A1* | 3/2014 | Loy et al. | 428/214 |
| 2014/0065393 A1* | 3/2014 | Lee et al. | 428/216 |
| 2014/0141547 A1* | 5/2014 | Kim | 438/26 |
| 2014/0263171 A1* | 9/2014 | Frantz et al. | 216/40 |
| 2014/0343218 A1* | 11/2014 | Kibayashi et al. | 524/538 |

FOREIGN PATENT DOCUMENTS

| | | |
|---|---|---|
| KR | 1020070103162 | 10/2007 |
| KR | 1020080102734 | 11/2008 |

* cited by examiner

DISPLAY DEVICE, METHOD OF MANUFACTURING THE DISPLAY DEVICE AND CARRIER SUBSTRATE FOR MANUFACTURING DISPLAY DEVICE

CLAIM OF PRIORITY

This application makes reference to, incorporates into this specification the entire contents of, and claims all benefits accruing under 35 U.S.C. §119 from an application earlier filed in the Korean Intellectual Property Office filed on Nov. 26, 2012 and there duly assigned Serial No. 10-2012-0134871.

BACKGROUND OF THE INVENTION

1. Field of the Invention

The present invention relates to a display device, a method of manufacturing the display device, and a carrier substrate for manufacturing the display device.

2. Description of the Related Art

Recently, display devices have been replaced with portable, thin flat panel display devices. From among flat panel display devices, organic or inorganic light emitting display devices which are self-emissive, have a wide angle of view, a high contrast ratio, and a high response speed are being noticed as next-generation display devices. In addition, an organic light emitting display device which includes an emissive layer formed of an organic material has better luminance, higher driving voltage, and higher response speed than inorganic light emitting display devices, and is capable of representing color images.

A thin display device is manufactured using a flexible substrate which is thin, and thus is likely to be damaged when a single thin flexible substrate is used in the manufacturing process of a flat panel display device. Accordingly, a flexible substrate is adhered to a carrier substrate and then inputted to the manufacturing process for flat panel display devices.

However, when a carrier substrate and a flexible substrate are adhered to each other and then heat is applied thereto, the flexible substrate may deform due to a difference in coefficients of thermal expansion (CTEs) between the carrier substrate and the flexible substrate which are formed of different materials. In particular, when the flexible substrate is deformed, problems may occur in terms of positions and alignment, etc. of each structure to be stacked on the flexible substrate.

SUMMARY OF THE INVENTION

The present invention provides a display device in which bending of a flexible substrate due to heat is prevented, a method of manufacturing the display device, and a carrier substrate for manufacturing the display device.

According to an aspect of the present invention, there is provided a method of manufacturing a display device, comprising: preparing a carrier substrate by forming an adhesive layer on a hard glass substrate; forming a flexible substrate on the adhesive layer; forming a thin film transistor and an organic light emitting element on the flexible substrate and encapsulating the organic light emitting element; and separating the carrier substrate and the flexible substrate by irradiating laser light; the adhesive layer being formed on the carrier substrate in such a state that tensile stress is applied.

The adhesive layer may be formed of a material including at least one of silicon nitride $SiN_x$, silicon dioxide ($SiO_2$), and an amorphous silicon (a-Si), and comprises a tensile stress layer that is formed in such a state that the tensile stress is applied.

The adhesive layer may be formed of an oxide thin film, and may further comprise an auxiliary adhesive layer stacked on the tensile stress layer.

The oxide thin film may comprise at least one of indium tin oxide (ITO), gallium zinc oxide (GZO), aluminum zinc oxide (AZO), amorphous silicon (a-Si), amorphous indium zinc oxide (a-IZO), titanium indium zinc oxide (TIZO), and gallium indium zinc oxide (GIZO).

The auxiliary adhesive layer may be formed by using a sputtering method.

The flexible substrate may be formed of a polyimide (PI) varnish or a PI film.

The method may further comprise providing a sacrificial layer between the hard glass substrate and the adhesive layer, the sacrificial layer being removed when the laser light is irradiated.

The sacrificial layer may comprise at least one of polyimide and silane.

When the carrier substrate and the flexible substrate are separated by irradiating the laser light, at least a portion of the adhesive layer may remain.

The method may further comprise curing the carrier substrate and the flexible substrate after forming the flexible substrate on the adhesive layer.

In the curing, tensile stress of the adhesive layer and compressive stress of the flexible substrate and the carrier substrate may be offset by each other.

When the carrier substrate and the flexible substrate are separated by irradiating the laser light, the adhesive may be removed together with the hard glass substrate.

The method may further comprise cleansing the adhesive layer before forming the flexible substrate.

According to another aspect of the present invention, there is provided a carrier substrate comprising: a hard glass substrate; and an adhesive layer that is formed on the hard glass substrate so as to have tensile stress.

The adhesive layer may be formed of a material including at least one of silicon nitride $SiN_x$, silicon dioxide ($SiO_2$), and an amorphous silicon (a-Si), and may comprise a tensile stress layer that is formed so as to have tensile stress.

The adhesive layer may be formed of an oxide thin film, and may comprise an auxiliary adhesive layer stacked on the tensile stress layer.

The oxide thin film may comprise at least one of indium tin oxide (ITO), gallium zinc oxide (GZO), aluminum zinc oxide (AZO), amorphous silicon (a-Si), amorphous indium zinc oxide (a-IZO), titanium indium zinc oxide (TIZO), and gallium indium zinc oxide (GIZO).

The carrier substrate may further comprise a sacrificial layer formed between the hard glass substrate and the adhesive layer.

The sacrificial layer may comprise at least one of polyimide and silane.

According to another aspect of the present invention, there is provided a display device comprising: a flexible substrate; a thin film transistor and an organic light emitting element formed on the flexible substrate; an encapsulation layer formed on the organic light emitting element; and an adhesive layer formed on an opposite side to a surface of the flexible substrate on which the organic light emitting element and the encapsulation unit are formed, wherein the adhesive layer is formed so as to have a tensile stress, the tensile stress being removed during a curing operation.

The adhesive layer may be formed of silicon nitride ($SiN_x$), and comprises a tensile stress layer that is formed to have tensile stress.

The adhesive layer may further comprise an auxiliary adhesive layer that is formed of an oxide thin film and is disposed between the tensile stress layer and the flexible substrate.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Hereinafter, the inventive concept will be described more fully with reference to the accompanying drawings, in which exemplary embodiments of the invention are shown. The inventive concept may, however, be embodied in many different forms and should not be construed as limited to the exemplary embodiments set forth herein. Rather, these embodiments are provided so that this disclosure will be thorough and complete, and will fully convey the scope of the invention to those of ordinary skill in the art. The terminology used herein is for the purpose of describing particular embodiments only and is not intended to be limiting of the inventive concept. As used herein, the singular forms 'a', 'an', and 'the' are intended to include the plural forms as well, unless the context clearly indicates otherwise. It will be further understood that the terms "comprises' and/or 'comprising,' when used in this specification, specify the presence of stated features, integers, operations, elements, and/or components, but do not preclude the presence or addition of one or more other features, integers, operations, elements, components, and/or groups thereof. It will be understood that, although the terms 'first', 'second', 'third', etc., may be used herein to describe various elements, components, regions, layers and/or sections, these elements, components, regions, layers and/or sections should not be limited by these terms. These terms are only used to distinguish one element, component, region, layer or section from another element, component, region, layer or section. As used herein, the term "and/or" includes any and all combinations of one or more of the associated listed items. Expressions such as "at least one of," when preceding a list of elements, modify the entire list of elements and do not modify the individual elements of the list.

FIGS. 1 through 9 are schematic cross-sectional views illustrating a method of manufacturing a display device according to an embodiment of the present invention.

Referring to FIGS. 1 through 9, the method of manufacturing a display device according to the current embodiment of the present invention includes providing a carrier substrate 100.

Figure 3:
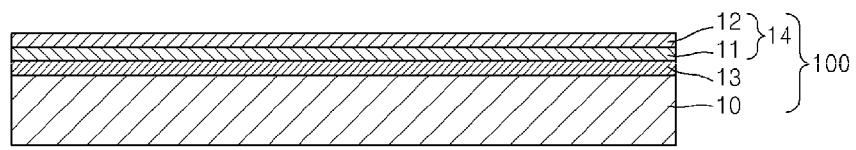

The carrier substrate 100 may include a hard glass substrate 10 and an adhesive layer 14 formed on the hard glass substrate 10 as illustrated in FIG. 3. Here, the adhesive layer 14 may be formed in such a state that tensile stress is applied thereto. The adhesive layer 14 may include a tensile stress layer 11 which is formed while a tensile stress is applied thereto and an auxiliary adhesive layer 12 formed on the tensile stress layer 11.

The carrier substrate 100 may include a sacrificial layer 13 formed between the adhesive layer 14 and the hard glass substrate 10. The sacrificial layer 13 may connect the adhesive layer 14 and the hard glass substrate 10 to each other or may connect the adhesive layer 14 and a flexible substrate 20, which will be described later.

Figure 4:
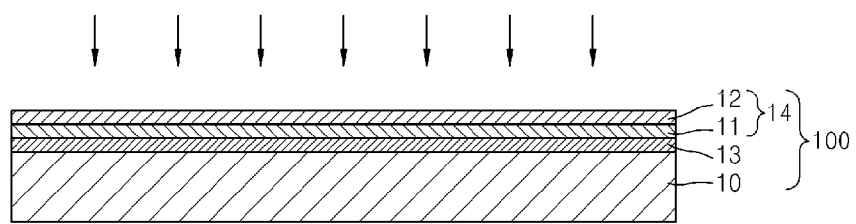

The carrier substrate 100 formed in the above-described manner may be stacked in various combinations. For example, the carrier substrate 100 may be formed such that only the tensile stress layer 11 is stacked on the hard glass substrate 10 (FIG. 2), or such that the tensile stress layer 11 is stacked after the sacrificial layer 13 is stacked on the hard glass substrate 10 (FIG. 3). Also, the carrier substrate 100 may be formed by sequentially stacking the tensile stress layer 11 and the auxiliary adhesive layer 12 on the hard glass substrate 10, or by stacking the sacrificial layer 13 on the hard glass substrate 10 and then sequentially stacking the tensile stress layer 11 and the auxiliary adhesive layer 12 thereon (FIG. 4). The manufacturing processes according to the stacking sequence are similar to embodiments that are to be described later, and the method of manufacturing a display device 200 by using the carrier substrate 100 is also similar to the embodiments that are to be described later, and thus hereinafter, for convenience of description, the description will focus on an embodiment in which the sacrificial layer 13, the tensile stress layer 11, and the auxiliary adhesive layer 12 are sequentially formed on the hard glass substrate 10.

Figure 1:
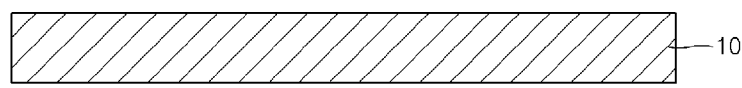
FIGS. 1 through 9 are schematic cross-sectional views illustrating a method of manufacturing a display device according to an embodiment of the present invention.

Referring to FIG. 1, first, the hard glass substrate 10 is prepared. The hard glass substrate 10 has to be laser-transmissive in a subsequent detaching operation, and thus is formed of a transparent material. Furthermore, since the hard glass substrate 10 has to support a display device to be formed on an upper surface thereof, the hard glass substrate 10 is formed of a hard material. For example, glass including $SiO_2$ as a main component may be used as a material of the hard glass substrate 10, or at least one of a borosilicate glass, a fused silica glass, and a quartz glass may be used.

Figure 2:
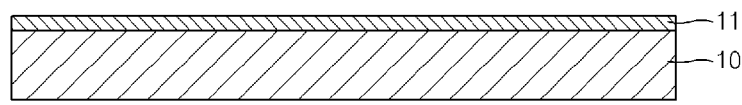

Next, referring to FIG. 2, after the hard glass substrate 10 is prepared as described above, the sacrificial layer 13 may be stacked on the hard glass substrate 10. Here, the sacrificial layer 13 may be easily exfoliated from the hard glass substrate 10 by laser irradiation, which will be described later. In detail, the sacrificial layer 13 may be formed to include at least one of polyimide (PI) and silane. In particular, the sacrificial layer 13 absorbs laser light of a unique wavelength band and a unique energy band when exposed to laser irradiation so that bonding between polymers of the sacrificial layer 13 is broken and the sacrificial layer 13 is exfoliated to be separated from the hard glass substrate 10.

Referring to FIG. 3, after the above operation is completed, the adhesive layer 14 may be formed on the sacrificial layer 13, and the adhesive layer 14 may be formed of the tensile stress layer 11 and the auxiliary adhesive layer 12 as described above.

In detail, the tensile stress layer 11 is formed on the sacrificial layer 13. The tensile stress layer 11 may be formed so as to directly contact an upper surface of the sacrificial layer 13. The tensile stress layer 11 may be formed in such a state that tensile stress is applied thereto.

In particular, the tensile stress layer 11 may be deposited by using a chemical vapor deposition (CVD) method. The stress applied to the tensile stress layer 11 may be variable according to operational conditions of a CVD method. For example, compressive stress or tensile stress may be applied to the tensile stress layer 11 according to operational conditions of a CVD method. In particular, when formed using a CVD method, the tensile stress layer 11 may be formed while being in such a state that tensile stress is applied thereto by increasing a layer forming speed.

Also, the tensile stress layer 11 may be formed to include at least one of silicon nitride $SiN_x$, silicon dioxide ($SiO_2$), and an amorphous silicon (a-Si). However, for convenience of description, the tensile stress layer 11 including silicon nitride $SiN_x$ will be described below. Also, the tensile stress layer 11 bonds and adheres the carrier substrate 100 and a flexible substrate 20 to each other so that the carrier 100 may support the display device 200 (see FIG. 7) during the manufacturing process.

The tensile stress layer 11 allows the carrier substrate 100, on which the sacrificial layer 13 is formed, and the flexible substrate 20 to be bonded to each other a first time by Van der Waals forces generated by surface morphology, and then the tensile stress layer 11 is cured in a high-temperature operation of the manufacturing process so as to rigidly adhere the carrier substrate 100 and the flexible substrate 20 to each other a second time.

Here, bonding refers to the attachment between two substrates by Van der Waals forces due to morphology, and adhesion refers to a more rigid attachment between the two substrates due to a chemical change caused by heat.

When the above operation is completed, the auxiliary adhesive layer 12 may be formed on the tensile stress layer 11. Here, the auxiliary adhesive layer 12 may be formed by using a sputtering method. The auxiliary adhesive layer 12 may include an oxide thin film. The oxide thin film may include at least one of indium tin oxide (ITO), gallium zinc oxide (GZO), aluminum zinc oxide (AZO), amorphous silicon (a-Si), amorphous indium zinc oxide (a-IZO), titanium indium zinc oxide (TIZO), and gallium indium zinc oxide (GIZO).

The above materials have good morphological characteristics. That is, the materials have relatively low morphology compared to that of other materials, and thus an interval between the materials and an attachment surface of the flexible substrate 20 is maintained as narrow as possible. Accordingly, due to the auxiliary adhesive layer 12 having the above morphological characteristics, large Van der Waals forces are applied between the carrier substrate 100 and the flexible substrate 20 to thereby bond the carrier substrate 100 and the flexible substrate 20. For convenience of description, the auxiliary adhesive layer 12 including ITO will be described below.

The carrier substrate 100 is manufactured by sequentially stacking the sacrificial layer 13, the tensile stress layer 11, and the auxiliary layer 12 formed on the hard glass substrate 10.

Next, referring to FIG. 4, a surface of the carrier substrate 100 is cleansed before bonding the flexible substrate 20 (see FIG. 5) on the carrier substrate 100 of FIG. 3. In detail, minute organic materials remaining on a surface of the auxiliary adhesive layer 12, to which the flexible substrate 20 is to be adhered, are removed. This facilitates good morphological characteristics and an increase in Van der Waals forces between the carrier substrate 100 and the flexible substrate 20 to thereby improve bonding forces. A wet cleansing method using a cleansing solution may be used as a cleansing method, but it is not limited thereto, and various cleansing methods, such as a dry cleansing method that involves blowing air, may also be used.

Figure 5:
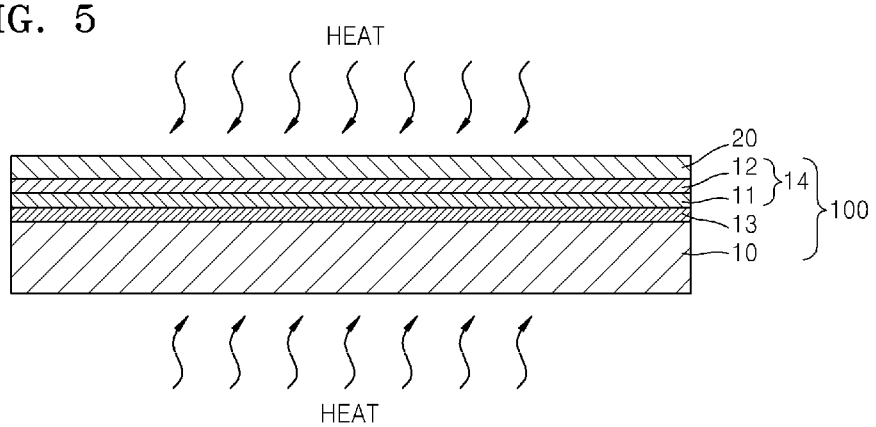

Next, referring to FIG. 5, the flexible substrate 20 may be formed on the carrier substrate 100. Here, the flexible substrate 20 may be formed of a polyimide (PI) varnish or a PI film. In particular, when the flexible substrate 20 is formed of a PI varnish, the flexible substrate 20 may be coated on the carrier substrate 100 by slit die coating.

After the above-described operation is performed, the carrier substrate 100 and the flexible substrate 20 may be cured by applying heat thereto. That is, the flexible substrate 20 may be hardened by applying heat thereto. When a curing operation is performed, the hard glass substrate 10, the sacrificial layer 13, the tensile stress layer 11, the auxiliary adhesive layer 12, and the flexible substrate 20 may be adhered to one another by heat.

In general, according to the conventional art, a curing operation is performed simply after forming the flexible substrate 20 on the hard glass substrate 10. In this case, due to different coefficients of thermal expansion (CTEs) of the hard glass substrate 10 and the flexible substrate 20, relative deformation may be caused in the flexible substrate 20 and the hard glass substrate 10. In particular, after the curing operation is completed, a compressive stress may occur due to the difference in CTEs of the hard glass substrate 10 and the flexible substrate 20, and the flexible substrate 20 may be deformed.

However, according to the current embodiment of the present invention, the carrier substrate 100 includes the tensile stress layer 11 in which tensile stress is generated, and thus deformation of the flexible substrate 20 due to a difference in CTEs may be prevented.

In detail, as described above, a curing operation may be performed while tensile stress is already applied to the tensile stress layer 11. Here, the tensile stress applied to the tensile stress layer 11 and compressive stress generated due to a difference in the CTEs of the hard glass substrate 10 and the flexible substrate 20 may be offset by each other. Accordingly, the stress applied to the flexible substrate 20 may not be present due to the offset between the tensile stress and the compressive stress or may hardly be generated.

Meanwhile, as described above, surfaces of the carrier substrate 100 and a lower surface of the flexible substrate 20 are adhered to each other by Van der Waals forces. As such, by forming a thin film transistor array and an organic light emitting device on the flexible substrate 20 that is bonded to the carrier substrate 100 and encapsulating the same, the display device 200 (see FIG. 7) may be manufactured.

Figure 6:
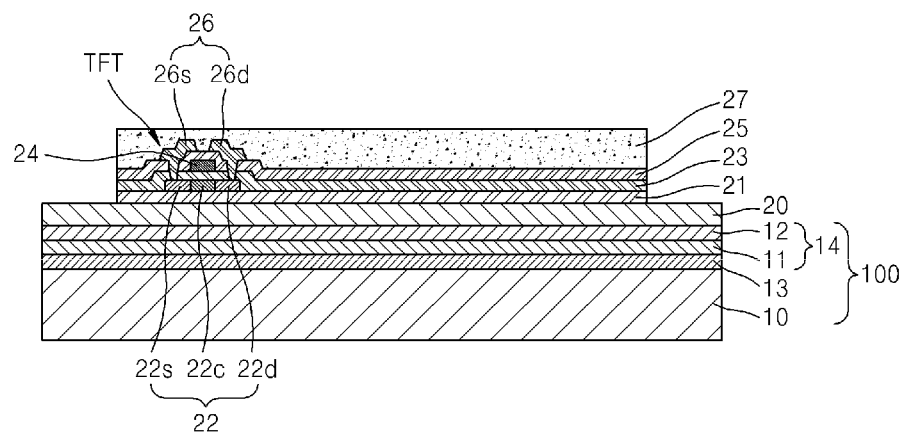

Next, referring to FIG. 6, a thin film transistor (TFT) array is formed on the flexible substrate 20. While one TFT is illustrated in FIG. 6 for convenience of description, the embodiments of the present invention are not limited thereto, and a plurality of TFTs and a plurality of storage capacitors may also be further included.

A buffer layer 21 may be formed on an upper surface of the flexible substrate 20 in order to provide planarization and prevent penetration of impurity elements. The buffer layer 21 may be deposited by using various deposition methods such as a plasma enhanced CVD (PECVD) method, an atmospheric pressure CVD (APCVD) method, and a low pressure CVD (LPCVD) method by using $SiO_2$ and/or $SiN_x$.

A TFT is formed on the buffer layer 21. At least one TFT is formed for each pixel so as to be electrically connected to an organic light emitting element or OLED (see FIG. 7), thereby driving the OLED. The TFT illustrated in FIG. 6 is a top gate type, and sequentially includes an active layer, a gate electrode, and a source/drain electrode. While a top gate type TFT is illustrated in the current embodiment of the present invention, the embodiments of the present invention are not limited thereto, and other TFTs of various types may be used, which will be obvious to one of ordinary skill in the art.

A semiconductor layer (not shown) is formed on the entire surface of the buffer layer 21. The semiconductor layer may be formed of an inorganic semiconductor such as amorphous silicon or an organic semiconductor. Amorphous silicon is crystallized to polycrystalline silicon using various methods. Examples of crystallization methods include a rapid thermal annealing (RTA) method, a solid phase crystallization (SPC) method, an excimer laser annealing (ELA) method, a metal induced crystallization (MIC) method, a metal induced lateral crystallization (MILC) method, and a sequential lateral solidification (SLS) method. A crystalline silicon layer obtained by the crystallization is patterned, and edge portions of source and drain regions may be doped with impurities and then activated to form an active layer 22 including a source region 22s, a drain region 22d, and a channel region 22c between the source and drain regions 22s and 22d, respectively.

Formation from the semiconductor layer to the active layer 22 involves a high temperature operation of about 300 degrees to about 500 degrees. For example, in the ELA method, a hydrogen content of amorphous silicon has to be as low as about 10% or less. Otherwise, when laser light is irradiated to perform crystallization, hydrogen is generated, and this deteriorates characteristics of polycrystalline silicon, and a TFT having excellent characteristics may not be manufactured. Accordingly, a high temperature annealing operation at about 300 degrees to about 500 degrees is performed to reduce a hydrogen content of a silicon layer. In addition, a high activation temperature of about 400 degrees is required also in an operation of forming the active layer 22 by doping polycrystalline silicon with impurities and activating the same.

By performing a high temperature operation during the formation of a TFT array, the auxiliary adhesive layer 12 of the carrier substrate 100 is cured to thereby rigidly adhere the flexible substrate 20 and the carrier substrate 100. However, since the sacrificial layer 13 between the flexible substrate 20 and the carrier substrate 100 may be exfoliated by using a laser, the flexible substrate 20 and the carrier substrate 100 may be detached from each other.

A gate insulating layer 23 formed of $SiO_2$, $SiN_x$ or the like is formed on the active layer 22 as described above, and a gate electrode 24 is formed on a predetermined region on the gate insulating layer 23. The gate electrode 24 is connected to a gate line (not shown) that applies an on/off signal of a TFT.

An interlayer insulating layer 25 is formed on the gate electrode 24, and a source electrode 26s and a drain electrode 26d are formed to contact the source region 22s and the drain region 22d of the active layers 22 via contact holes. The TFT is covered by a passivation layer 27.

The passivation layer 27 may be formed of an inorganic insulating layer and/or an organic insulating layer. Examples of the inorganic insulating layer may include $SiO_2$, $SiN_x$, SiON, $Al2O_3$, $TiO_2$, $Ta_2O_5$, $HfO_2$, $ZrO_2$, BST, and PZT, and examples of the organic insulating layer include general polymers (PMMA, PS), a polymer derivative having a phenol group, an acrylic polymer, an imide polymer, an arylether polymer, an amide polymer, a fluorine polymer, a p-xylene polymer, a vinylacoholic polymer, and blends thereof. Also, the passivation layer 27 may be formed of a complex stack structure including an inorganic insulating layer and an organic insulating layer.

Figure 7:
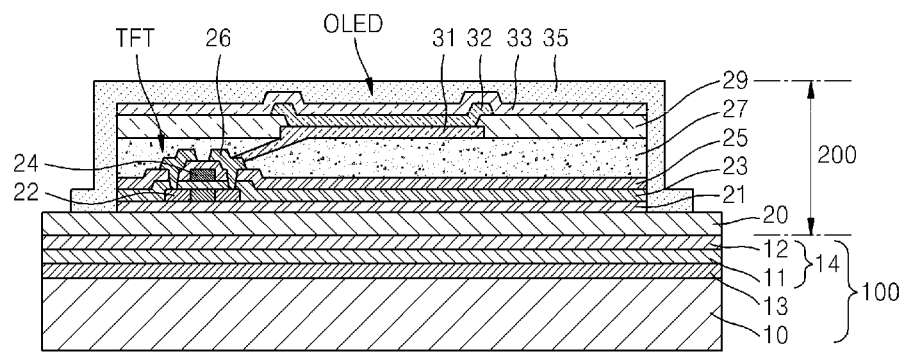

An OLED is formed on the passivation layer 27. Referring to FIG. 7, the OLED includes a pixel electrode 31 formed on the passivation layer 27, an opposite electrode 33 facing the pixel electrode 31, and an intermediate layer 32 interposed therebetween. A display device 200 is classified as a bottom emission type, a top emission type, and a dual emission type. In a bottom emission type display device, the pixel electrode 31 is used as a light-transmissive electrode, and the opposite electrode 33 is used as a reflective electrode. In a top emission type display device, the pixel electrode 31 is used as a reflective electrode, and the opposite electrode 33 is used as a semi-transmissive electrode. While a bottom emission type display device is described in the current embodiment of the present invention, the embodiments of the present invention are not limited thereto.

The pixel electrode 31 is formed of a transparent layer formed of a material having a high work function, such as ITO, IZO, ZnO or $In_2O_3$. The pixel electrode 31 may be patterned in an island form corresponding to each pixel. Also, the pixel electrode 31 may be connected to an external terminal (not shown) so as to function as an anode electrode.

Meanwhile, a pixel define layer (PDL) 29, which is formed of an insulating material, is formed on the pixel electrode 31 to cover the same. A predetermined opening portion is formed in the PDL 29, and then an intermediate layer 32, which will be described later, is formed in an area limited to this opening portion.

The opposite electrode 33 may be formed of a material having a small work function, such as Li, Ca, LiF/Ca, LiF/Al, Al, Mg, or Ag. The opposite electrode 33 may be formed over the entire light emission area on which an image is realized. Also, the opposite electrode 33 may be connected to an external terminal (not shown) so as to function as a cathode electrode.

Polarities of the pixel electrode 31 and the opposite electrode 33 may also be exchanged.

The intermediate layer 32 may include an organic emissive layer which emits light, and a low-molecular organic material or a polymer organic material may be used to form the organic emissive layer. When the organic emissive layer is formed of a low-molecular organic material, a hole transport layer (HTL) and a hole injection layer (HIL) or the like are stacked with respect to the organic emissive layer toward the pixel electrode 31, and an electron transport layer (ETL) and an electron injection layer (EIL) are stacked toward the opposite electrode 33. Obviously, other various layers than the HIL, the HTL, the ETL, and the EIL may also be stacked according to necessity.

When the organic emissive layer is formed of a polymer organic material, only a HTL may be included with respect to the organic emissive layer toward the pixel electrode 31. The polymer HTL may be formed of a material such as poly-(2,4)-ethylene-dihydroxy thiophene (PEDOT) or a polyaniline (PANI) on the pixel electrode 31 and by using a method such as an inkjet printing method or a spin coating method.

Next, further referring to FIG. 7, the thin film transistor and the organic light emitting element are encapsulated to block water or air from the outside. The encapsulation layer may be formed by forming a thin encapsulation film 35 and using an encapsulation substrate on the thin film transistor and the organic light emitting element to protect the display device 200. The encapsulation film 35 may have a structure in which a layer formed of an inorganic material such as a silicon nitride and a layer formed of an organic material such as epoxy or polyimide are alternately stacked, but is not limited thereto. Alternatively, the thin film transistor and the organic light emitting element may be encapsulated by using an encapsulation substrate. The encapsulation substrate may be a glass substrate or a plastic substrate or a stainless using steel (SUS), and the flexible substrate 20 and the encapsulation substrate may be bonded to each other by using a sealing member that is disposed along edge portions thereof.

Figure 8:
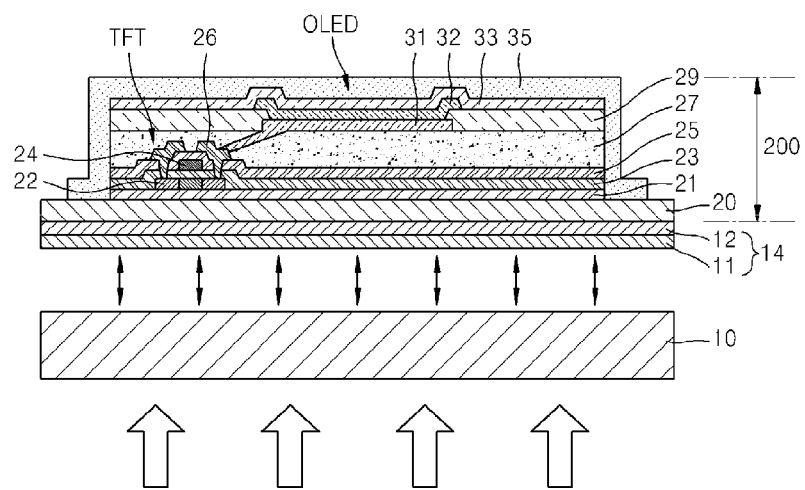
Figure 9:
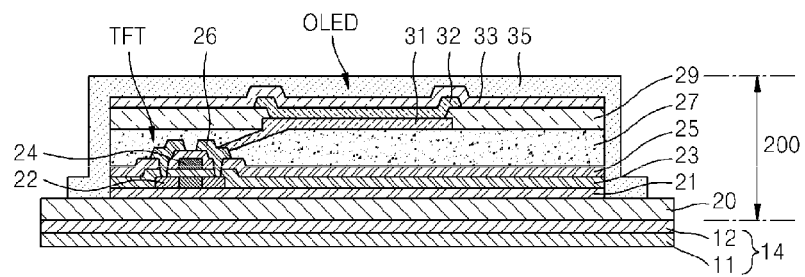

Next, referring to FIGS. 8 and 9, laser is irradiated to separate the carrier substrate 100 and the flexible substrate 20. In detail, a laser having a predetermined wavelength and a predetermined energy band is irradiated onto the sacrificial layer 13 of the carrier substrate 100 so that polymers of the sacrificial layer 13 absorb the laser of the predetermined wavelength and the predetermined energy band and bonding between polymer chains are broken to exfoliate the sacrificial layer 13.

A range of the wavelength band of the irradiated laser is from 250 nm to 350 nm, and a range of the energy band is from 250 mJ/cm$^2$ to 350 mJ/cm$^2$. If the wavelength band is less than 250 nm or exceeds 350 nm, bonding of polymer chains in the sacrificial layer 13 may not be broken, and thus the sacrificial layer 13 is not exfoliated. Meanwhile, if the energy band is less than 250 mJ/cm$^2$, bonding of polymer chains in the sacrificial layer 13 may not be broken, and thus the sacrificial layer 13 is not exfoliated. If the energy band exceeds 350 mJ/cm$^2$, other members may be damaged.

In the display device 200 from which the carrier substrate 100 is detached, as described above, the adhesive layer 14 remains on the lower surface of the flexible substrate 20. The adhesive layer 14 protects a lower surface of the display device 200, and thus there is no need to attach an additional protection film subsequently.

The carrier substrate 100 is easily bonded and adhered to the flexible substrate 20 during the manufacturing process of the display device 200 in which the flexible substrate 20 is used so as to thereby support the flexible substrate 20 during the manufacturing process and to prevent damage. Moreover, the carrier substrate 100 may be easily detached later and thus does not cause defects in the display device 200. Meanwhile, the adhesive layer 14 remains on the lower surface of the display device 200 so as to function as a protection layer, and thus a subsequent protection film formation process may be omitted.

Also, when manufacturing the display device 200, deformation of the flexible substrate 20 is prevented by using the tensile stress layer 11 to which tensile stress is applied, thereby preventing problems such as pattern misalignment of the display device 200, vacuum error of a robot arm used in the manufacturing process, cracking of the hard glass substrate 10, or thin film lifting.

Meanwhile, while the OLED is formed on the passivation layer 27 when referring to FIG. 6, the embodiments of the present invention are not limited thereto, and the OLED may also be formed on the gate insulating layer 23 or the interlayer insulating layer 25 by using a mask reduction process.

Figure 10:
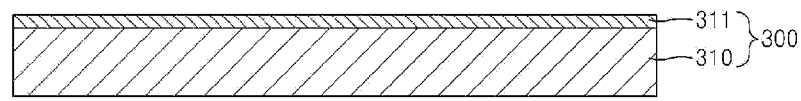
FIG. 10 is a schematic cross-sectional view illustrating a display device according to an embodiment of the present invention.
Figure 10:
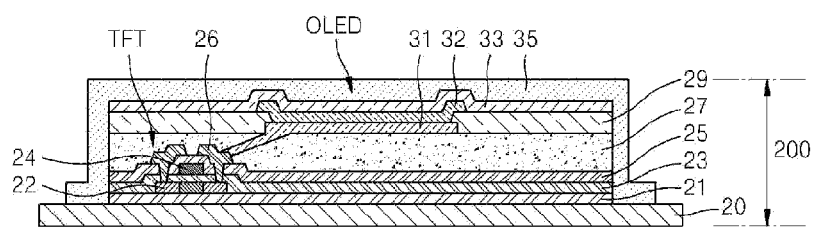

FIG. 10 is a schematic cross-sectional view illustrating a display device according to an embodiment of the present invention.

Referring to FIG. 10, the display device 200 may be manufactured in the same or a similar manner as described above with reference to FIGS. 1 through 9. A carrier substrate 300 for manufacturing the display device 200 may include a hard glass substrate 310 and an adhesive layer (not shown). Also, the adhesive layer may include a tensile stress layer 311. The tensile stress layer 311 is the same as the tensile stress layer 11 described above, and thus a description thereof will be omitted here.

The tensile stress layer 311 may be used to bring the hard glass substrate 310 and the flexible substrate 20 into contact. The tensile stress layer 311 may be stacked on the hard glass substrate 310 in such a state that tensile stress is applied thereto.

Also, when the tensile stress layer 311 is cured, if compressive stress is applied due to a difference in CTEs of the flexible substrate 20 and the hard glass substrate 310 as described above, the compressive stress may be offset to thereby prevent deformation of the flexible substrate 20.

After the curing operation is completed, each element may be stacked on the flexible substrate 20 to complete the display device 200. Here, an encapsulation operation is performed after the display device 200 is completely manufactured, and then laser light is irradiated thereto to separate the carrier substrate 300 and the display device 200.

In particular, when the laser light is irradiated as described above, the carrier substrate 300 and the flexible substrate 20 may be separated as polymers of the tensile stress layer 311 are separated from one another. The laser light may have a predetermined wavelength and a predetermined energy band so as to break bonding between polymer chains of the tensile stress layer 311. In detail, a range of the wavelength band of the irradiated laser light is from 250 nm to 350 nm, and a range of the energy band is from 500 mJ/cm$^2$ to 800 mJ/cm$^2$. In particular, if the wavelength band is less than 500 mJ/cm$^2$, bonding of polymer chains in the tensile stress layer 311 may not be broken, and thus the tensile stress layer 311 is not exfoliated. If the energy band exceeds 800 mJ/cm$^2$, other members may be damaged.

A portion of the tensile stress layer 311 may remain on a surface of the display device 200. In particular, in this case, an etchant may be used or an organic solvent may be used for cleansing to thereby completely remove the tensile stress layer 311.

Accordingly, when manufacturing the display device 200, deformation of the flexible substrate 20 is prevented via the tensile stress layer 311 to which tensile stress is applied so as to prevent problems, such as pattern misalignment of the display device 200, vacuum error of a robot arm used in the manufacturing process, cracking of the hard glass substrate 10, or thin film lifting.

Figure 11:
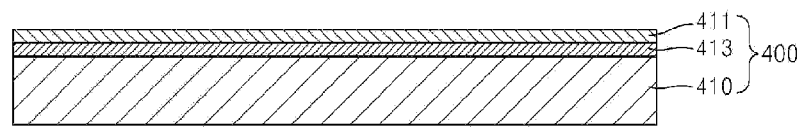
FIG. 11 is a schematic cross-sectional view illustrating a display device according to another embodiment of the present invention.
Figure 11:
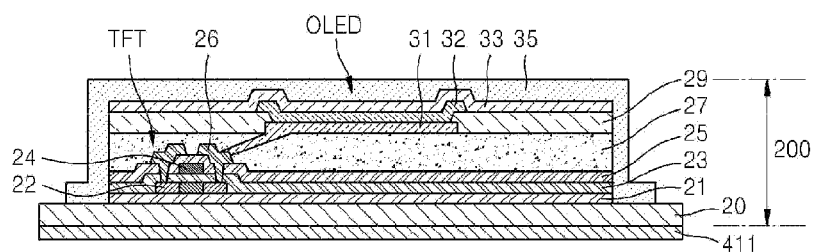

FIG. 11 is a schematic cross-sectional view illustrating a display device according to another embodiment of the present invention.

Referring to FIG. 11, the display device 200 may be manufactured in the same or similar manner as described above with reference to FIGS. 1 through 9. A carrier substrate 400 for manufacturing the display device 200 may include a hard glass substrate 410, an adhesive layer (not shown), and an adhesive layer 413. Also, the adhesive layer may include a tensile stress layer 411. The tensile stress layer 411 is the same as the tensile stress layer 11 described above, and thus a description thereof will be omitted here.

The tensile stress layer 411 may be used to bring the hard glass substrate 410 and the flexible substrate 20 into contact. The tensile stress layer 411 may be stacked on the hard glass substrate 410 in such a state that tensile stress is applied thereto.

Also, when the tensile stress layer 411 is cured, if a compressive stress is applied due to a difference in the CTEs of the flexible substrate 20 and the hard glass substrate 410 as described above, the compressive stress may be offset to thereby prevent deformation of the flexible substrate 20.

Meanwhile, after the curing operation is completed, each element may be stacked on the flexible substrate 20 to complete the display device 200. Here, an encapsulation operation may be performed after the display device 200 is completely manufactured, and then laser light may be irradiated thereto to separate the carrier substrate 400 and the display device 200.

In particular, when laser light is irradiated as described above, the carrier substrate 400 and the flexible substrate 20 may be separated from each other as polymers of a sacrificial layer 413 are separated from one another. The laser light may have a predetermined wavelength and a predetermined energy band so as to break bonding between polymer chains of the sacrificial layer 413. In detail, a range of the wavelength band of the irradiated laser is from 250 nm to 350 nm, and a range of the energy band is from 250 mJ/cm$^2$ to 350 mJ/cm$^2$. In particular, if the energy band is less than 250 mJ/cm$^2$, bonding of polymer chains in the sacrificial layer 413 may not be broken, and thus the sacrificial layer 413 is not exfoliated. If the energy band exceeds 350 mJ/cm$^2$, other members may be damaged.

Accordingly, when manufacturing the display device 200, deformation of the flexible substrate 20 is prevented via the tensile stress layer 411 to which tensile stress is applied so as to prevent problems, such as pattern misalignment of the display device 200, vacuum error of a robot arm used in the manufacturing process, cracking of the hard glass substrate 410, or thin film lifting.

Also, in the display device 200, the tensile stress layer 411 may be coated on the flexible substrate 20 so as to effectively prevent penetration of water and foreign substances into the flexible substrate 20.

Figure 12:
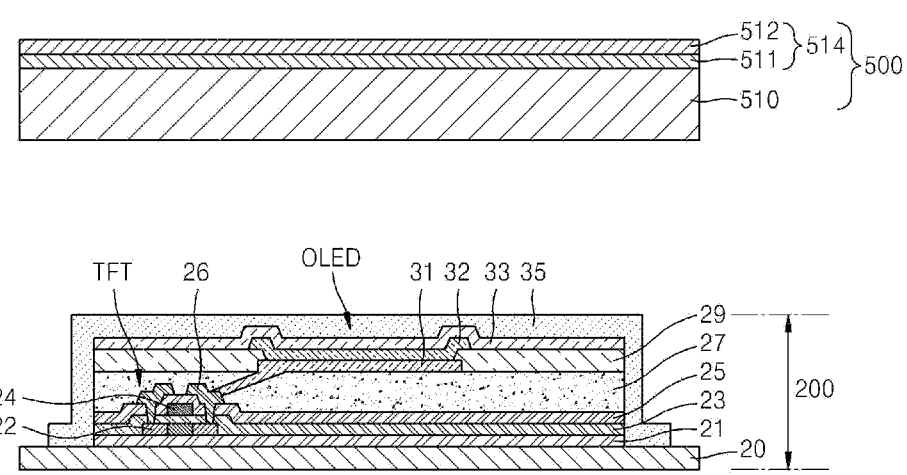
FIG. 12 is a schematic cross-sectional view illustrating a display device according to another embodiment of the present invention.

FIG. 12 is a schematic cross-sectional view illustrating a display device according to another embodiment of the present invention.

Referring to FIG. 12, the display device 200 may be manufactured in the same or similar manner as described above with reference to FIGS. 1 through 9. A carrier substrate 500 for manufacturing the display device 200 may include a hard glass substrate 510 and an adhesive layer 514. Also, the adhesive layer 514 may include a tensile stress layer 511 and an auxiliary adhesive layer 512. The tensile stress layer 511 and the auxiliary adhesive layer 512 are the same as the tensile stress layer 11 and the auxiliary adhesive layer 12 described above, and thus a description thereof will be omitted here.

The tensile stress layer 511 may be used to bring the hard glass substrate 510 and the flexible substrate 20 into contact. The tensile stress layer 511 may be stacked on the hard glass substrate 510 in such a state that tensile stress is applied thereto.

Also, when the tensile stress layer 511 is cured, if compressive stress is applied due to a difference in the CTEs of the flexible substrate 20 and the hard glass substrate 510 as described above, the compressive stress may be offset to thereby prevent deformation of the flexible substrate 20.

Meanwhile, after the curing operation is completed, each element may be stacked on the flexible substrate 20 to complete the display device 200. Here, an encapsulation operation may be performed after the display device 200 is completely manufactured, and then laser light may be irradiated thereto to separate the carrier substrate 500 and the display device 200.

In particular, when the laser light is irradiated as described above, the carrier substrate 500 and the flexible substrate 20 may be separated as polymers of the tensile stress layer 511 and the auxiliary adhesive layer 512 are separated from one another. The laser light may have a predetermined wavelength and a predetermined energy band so as to break bonding between polymer chains of the tensile stress layer 511 and the auxiliary adhesive layer 512 and to exfoliate the tensile stress layer 511 and the auxiliary adhesive layer 512. In particular, in this regard, just portions or all of the tensile stress layer 511 and the auxiliary adhesive layer 512 may be removed.

In detail, a range of wavelength bands of the irradiated laser light is from 250 nm to 350 nm, and a range of the energy band is from 500 mJ/cm$^2$ to 1000 mJ/cm$^2$. If the energy band is less than 500 mJ/cm$^2$, bonding of polymer chains in the tensile stress layer 511 and the auxiliary adhesive layer 512 may not be broken, and if the energy band exceeds 1000 mJ/cm$^2$, other members may be damaged.

Accordingly, when manufacturing the display device 200, deformation of the flexible substrate 20 is prevented via the tensile stress layer 511 to which tensile stress is applied so as to prevent problems, such as pattern misalignment of the display device 200, vacuum error of a robot arm used in the manufacturing process, cracking of the hard glass substrate 510, or thin film lifting.

According to the embodiments of the present invention, when manufacturing a display device, deformation of a flexible substrate is prevented by using a tensile stress layer in which tensile stress is generated, and accordingly, problems such as pattern misalignment of the display device, vacuum error of a robot arm used in the manufacturing process, cracking of a hard glass substrate, and thin film lifting may be overcome.

While the present invention has been particularly shown and described with reference to exemplary embodiments thereof, it will be understood by those of ordinary skill in the art that various changes in form and detail may be made therein without departing from the spirit and scope of the present invention as defined by the following claims.

What is claimed is:

1. A method of manufacturing a display device, comprising the steps of:
preparing a carrier substrate by forming an adhesive layer on a hard glass substrate;
forming a flexible substrate on the adhesive layer;
forming a thin film transistor and an organic light emitting element on the flexible substrate and encapsulating the organic light emitting element; and
separating the carrier substrate and the flexible substrate by irradiating laser light;
the adhesive layer being formed on the carrier substrate in such a state that tensile stress is applied; and
the adhesive layer being formed of a material including at least one of silicon nitride (SiN$_x$), silicon dioxide (SiO$_2$), and an amorphous silicon (a-Si), and comprising a tensile stress layer that is formed in such a state that the tensile stress is applied.

2. The method of claim 1, the adhesive layer being formed of an oxide thin film, and further comprising an auxiliary adhesive layer stacked on the tensile stress layer.

3. The method of claim 2, the oxide thin film comprising at least one of indium tin oxide (ITO), gallium zinc oxide (GZO), aluminum zinc oxide (AZO), amorphous silicon (a-Si), amorphous indium zinc oxide (a-IZO), titanium indium zinc oxide (TIZO), and gallium indium zinc oxide (GIZO).

4. The method of claim 2, the auxiliary adhesive layer being formed by using a sputtering method.

5. The method of claim 1, the flexible substrate being formed of one of a polyimide (PI) varnish and a PI film.

6. The method of claim 1, further comprising a sacrificial layer disposed between the hard glass substrate and the adhesive layer, the sacrificial layer being removed when the laser light is irradiated.

7. The method of claim 6, the sacrificial layer comprising at least one of polyimide and silane.

8. The method of claim 1, at least a portion of the adhesive layer remaining when the carrier substrate and the flexible substrate are separated by irradiating the laser light.

9. A method of manufacturing a display device, comprising the steps of:
preparing a carrier substrate by forming an adhesive layer on a hard glass substrate;
forming a flexible substrate on the adhesive layer;
forming a thin film transistor and an organic light emitting element on the flexible substrate and encapsulating the organic light emitting element; and
separating the carrier substrate and the flexible substrate by irradiating laser light;
the adhesive layer being formed on the carrier substrate in such a state that tensile stress is applied;
said method further comprising the step of curing the carrier substrate and the flexible substrate after forming the flexible substrate on the adhesive layer.

10. The method of claim 9, tensile stress of the adhesive layer and compressive stress of the flexible substrate and the carrier substrate being offset by each other in the curing step.

11. The method of claim 1, the adhesive being removed together with the hard glass substrate when the carrier substrate and the flexible substrate are separated by irradiating the laser light.

12. A method of manufacturing a display device, comprising the steps of:
preparing a carrier substrate by forming an adhesive layer on a hard glass substrate;
forming a flexible substrate on the adhesive layer;
forming a thin film transistor and an organic light emitting element on the flexible substrate and encapsulating the organic light emitting element; and
separating the carrier substrate and the flexible substrate by irradiating laser light;
the adhesive layer being formed on the carrier substrate in such a state that tensile stress is applied;
said method further comprising the step of cleansing the adhesive layer before forming the flexible substrate.

13. A carrier substrate, comprising:
a hard glass substrate; and
an adhesive layer that is formed on the hard glass substrate so as to have tensile stress;
the adhesive layer being formed of a material including at least one of silicon nitride ($SiN_x$), silicon dioxide ($SiO_2$), and an amorphous silicon (a-Si), and comprising a tensile stress layer that is formed so as to have tensile stress.

14. The carrier substrate of claim 13, the adhesive layer being formed of an oxide thin film, and comprising an auxiliary adhesive layer stacked on the tensile stress layer.

15. The carrier substrate of claim 14, the oxide thin film comprising at least one of indium tin oxide (ITO), gallium zinc oxide (GZO), aluminum zinc oxide (AZO), amorphous silicon (a-Si), amorphous indium zinc oxide (a-IZO), titanium indium zinc oxide (TIZO), and gallium indium zinc oxide (GIZO).

16. The carrier substrate of claim 13, further comprising a sacrificial layer formed between the hard glass substrate and the adhesive layer.

17. The carrier substrate of claim 16, the sacrificial layer comprising at least one of polyimide and silane.

* * * * *